United States Patent [19]
Coccetti et al.

[11] Patent Number: 4,916,371
[45] Date of Patent: Apr. 10, 1990

[54] VERTICAL DEFLECTION CIRCUIT FOR KINESCOPE YOKES, WITH FLYBACK VOLTAGE GENERATOR

[75] Inventors: Silvano Coccetti, Vittuone; Mauro Merlo, Villasanta; Roberto Viscardi, Lissone, all of Italy

[73] Assignee: SGS Thomson Microelectronics spa, Catania, Italy

[21] Appl. No.: 210,814

[22] Filed: Jun. 24, 1988

[30] Foreign Application Priority Data

Jul. 2, 1988 [IT] Italy .............................. 21166 A/87

[51] Int. Cl.$^4$ ......................... H01J 29/70; H01J 29/76
[52] U.S. Cl. ..................................... 315/397; 315/395
[58] Field of Search ................ 315/393, 395, 396, 397

[56] References Cited

U.S. PATENT DOCUMENTS

| | | | |
|---|---|---|---|
| 4,055,784 | 10/1977 | Tanaka | 315/397 |
| 4,289,994 | 9/1981 | Beaumont et al. | 315/371 |
| 4,297,621 | 10/1981 | Spilsbury | 315/397 |
| 4,677,352 | 6/1987 | Sibovits et al. | 315/408 |

Primary Examiner—Theodore M. Blum
Attorney, Agent, or Firm—Wolf, Greenfield & Sacks

[57] ABSTRACT

The circuit, particularly suitable for high-definition monitors, wherein a power amplifier is fed by a supply voltage source to generate a deflection current in a yoke, furthermore comprises switching means which are activatable to connect another source of a supply voltage higher than the source to the amplifier, and flyback detector means to activate said switching means at the beginning of the flyback.

7 Claims, 1 Drawing Sheet

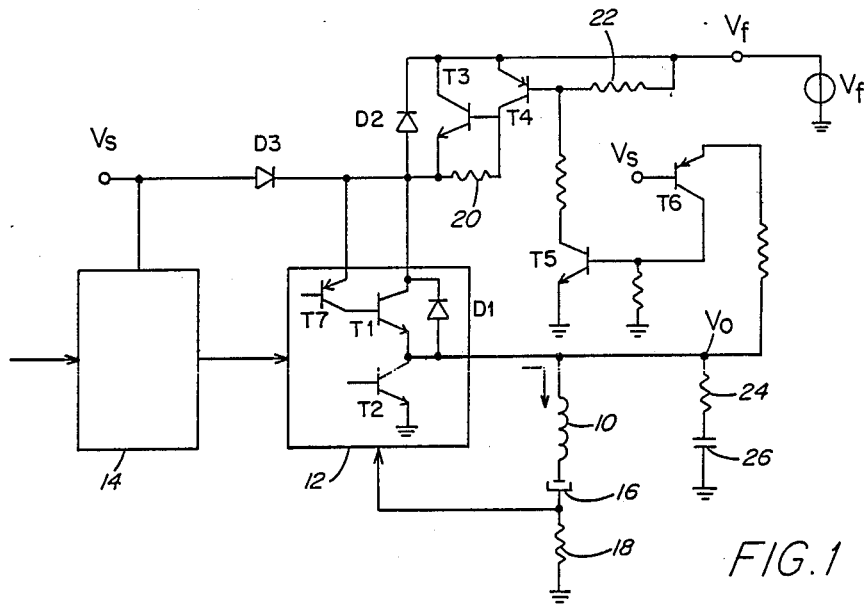
FIG.1
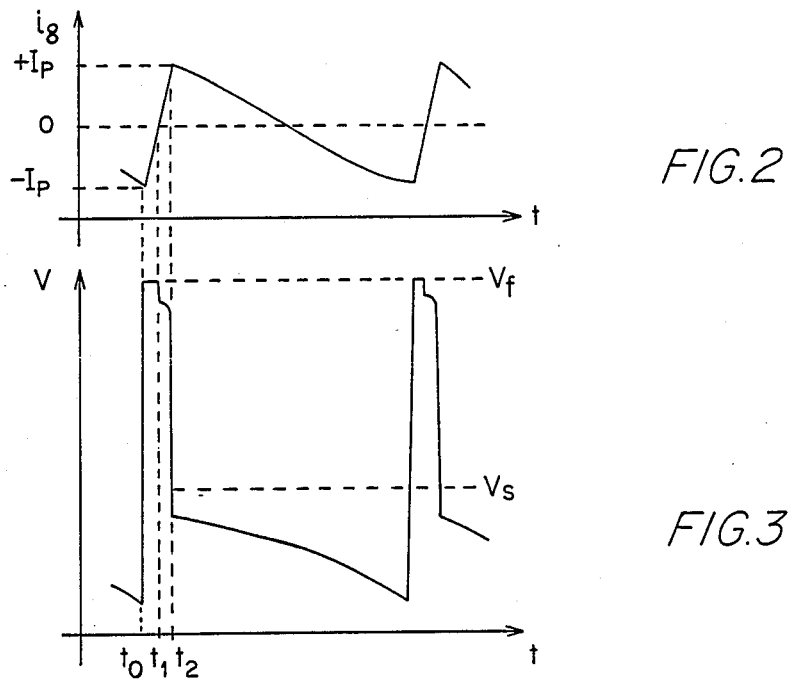
FIG.2
FIG.3 ndifferenceferences## VERTICAL DEFLECTION CIRCUIT FOR KINESCOPE YOKES, WITH FLYBACK VOLTAGE GENERATOR

BACKGROUND OF THE INVENTION

1. Field of the Invention

The present invention relates to a vertical deflection circuit for yokes of kinescopes, with improved flyback generator, particularly for high-definition monitors and kinescopes.

2. Prior Art

As is known, to rapidly reverse the current in the vertical deflection yoke of a cathode-ray tube during flyback, higher voltages than that applied during the scanning period, which is approximately equivalent to the yoke current ($I_{pp}$) multiplied by the impedance of the load, are generally required.

To generate this voltage while keeping the average power dissipation low, the Italian patent No. 992.626 in the name of the Applicant proposed a circuital solution, adopted in almost all vertical deflection circuits, constituted by a voltage doubling circuit, employing the charge of an electrolytic capacitor, which allows to apply twice the supply voltage to the vertical deflection coil only for the return period, during which the rapid reversal of the current is required.

This prior solution is adequate for kinescopes of commercial television sets, since a voltage equal to twice the minimum value is sufficient to reverse the current in a time shorter than the vertical blackout time tB, which is usually approximately equal to 1.4 msec.

Instead, in application to monitors, particularly of the high-definition type, where the vertical blackout time must be shorter than 0.5 msec (both due to the reduction of the frame time and because it is desired to employ the visualized area to its optimum), the ratio between the flyback $V_f$, which minimizes the return time, and the minimum supply $V_s$, which corresponds to the minimum power dissipation, must be of the order of $V_f/V_s = 3 \div 4$.

For this reason, the flyback voltage generator of said antedated patent is no longer adequate ($V_f/V_s = 2$).

SUMMARY OF THE INVENTION

The aim of the present invention is therefore to provide a vertical deflection circuit for yokes of kinescopes and monitors, particularly of the high-definition type, with a flyback generator which is capable of providing the flyback voltages required for the reversal of the yoke current, with reduced dissipated power and great flexibility of use for all types of yokes.

An object of the invention is also to provide said vertical deflection circuit while saving one electrolytic capacitor in the conventional application.

This aim and this object, as well as other objects and advantages which will become apparent hereinafter, are achieved by the invention with a vertical deflection circuit for yokes for kinescopes and monitors, particularly of the high-definition type, wherein a power amplifier is fed by a first supply voltage source to generate in said yoke a deflection current, characterized in that it furthermore comprises switching means activatable to connect to the amplifier a second source of a supply voltage higher than said first source, and flyback detector means for activating said switching means at the beginning of the flyback.

BRIEF DESCRIPTION OF THE DRAWINGS

A preferred embodiment of the invention, given merely by way of example, is now described with reference to the accompanying drawings, wherein:

FIG. 1 is a diagram of a vertical deflection circuit with flyback generator according to a preferred embodiment of the invention;

FIG. 2 is a diagram of the yoke current supplied by the circuit of FIG. 1; and

FIG. 3 is a diagram of the output voltage of the circuit of FIG. 1.

DETAILED DESCRIPTION OF THE DRAWINGS

In FIG. 1 a vertical deflection yoke 10 of a cathode-ray tube (not shown) is driven by a power amplifier 12, of which only the two final transistors T1, T2 and a prefinal transistor T7 are indicated. A diode D1 is connected to the ends of the transistor T1. The amplifier 12 is driven by a per se known saw-tooth wave generator 14. The opposite end of the deflection yoke 10 is connected to the ground through an electrolytic capacitor 16 and a resistor 18, from the ends whereof a feedback volume is drawn which is sent, again as is known, to the power amplifier 12.

The saw-tooth wave generator 14 is fed by a supply voltage $V_s$, and the same voltage normally feeds the amplifier 12 through a diode D3. A diode D2 leads to the supply node of the amplifier 12 and is connected to a second supply voltage $V_f$ higher than $V_s$. In parallel to the diode D2, two transistors T3 with common collector and T4 with common emitter are connected, with bias resistors 20, 22. The assembly of the diodes D2, D3 and of the transistors T3, T4 acts as switching means, as will become apparent hereinafter.

The output $V_o$ of the power amplifier 12 also drives a flyback detector circuit which comprises a resistor 24 with a series-connected compensating capacitor 26, which controls a common-base transistor T6, which in turn controls the base of a transistor T5 for the control of the transistor T4.

The transistors T3, T4, T5 and T6 are normally off, and the diode D2 is also off. Therefore the voltage $V_f$ does not normally reach the amplifier 12, which is fed exclusively by the voltage $V_s$.

With reference to FIG. 2, at the instant $t_o$ the yoke current $i_g$ is maximum in entry at the output of the amplifier 12, i.e. its value is $-I_p$. The beginning of the flyback is caused by the switching off of the lower power transistor T2. Starting from this instant, the voltage at the output of the amplifier 12 rises rapidly, with a gradient determined by the current peak $-I_p$ and by the value of the compensating capacitor 26, while the same current closes its path towards the ground through diodes D1, D2, and $V_f$.

When the voltages at the output of the amplifier 12 exceeds $V_s$ (see also FIG. 3), the transistor T6 starts conducting, and thus saturates transistors T5 and T4, while transistor T3 starts conducting. Thus, at this point all the voltage $V_f$ plus the direct voltage drop on the two diodes D1 and D2 is applied to the yoke 10. Conversely, the diode D3 becomes inversely biased, decoupling the final stage from $V_s$. The current $i_g$ then reverses its gradient, until it exceeds zero (instant $t_1$), and at this point the diodes D1 and D2 switch off. The new path towards the ground becomes $V_f$, T4, T3, T7, T1:

this produces a voltage step V towards the ground equal to $4V_{be}+2V_{ceSAT}$.

When the current $i_g$, in its rising phase, reaches $+I_p$ (instant $t_2$), the feedback loop from the yoke to the saw-tooth wave generator returns the final stage, constituted by transistors T1 and T2, to its normal dynamics, and the current follows the scanning gradient.

The need for a second supply source $V_f$ is usually not an inconvenience, since such a source is normally already present for other purposes in this type of application, and also because no particular output impedance characteristics are required.

A preferred embodiment of the invention has been described, but it is understood that it is susceptible to equivalent modifications and variations on the part of the expert in this field, according to the given teachings, without thereby abandoning the scope of the inventive concept.

We claim:

1. Vertical deflection circuit for yokes of kinescopes and monitors, particularly of the high-definition type, wherein a power amplifier is fed by a first supply voltage source to generate in said yoke a deflection current, said vertical deflection circuit comprising switching means activatable to connect to the amplifier a second source of a supply voltage higher than said first source, and flyback detector means for activating said switching means at the beginning of the flyback, characterized in that said switching means comprises at least one normally off transistor coupled to said second supply source and said amplifier and a normally forward biased diode between said first supply source and said amplifier, and in that said flyback detector means is adapted to make said transistor conduct when the voltage across the ends of the yoke exceeds the value of the voltage of the first source.

2. Vertical deflection circuit according to claim 1, characterized in that said flyback detector means comprise at least one transistor controlled by the voltage across the ends of the yoke.

3. Vertical deflection circuit according to claim 1 wherein said switch means comprises a pair of transistors both of which are maintained non-conducting during the sweeping phase.

4. Vertical deflection circuit according to claim 3 wherein said pair of transistors are connected in cascade.

5. Vertical deflection circuit for yokes of kinescopes and monitors, particularly of the high definition type, wherein a power amplifier is fed by a first supply voltage source to generate in said yoke a deflection current, said vertical deflection circuit comprising switching means activatable to connect to the amplifier a second source of a supply voltage higher than first source, and flyback detector means for activating said switch means at the beginning of the flyback, characterized in that said switching means comprises a pair of transistors both of which are maintained non-conducting during the sweeping phase.

6. Vertical deflection circuit according to claim 6 wherein said pair of transistors are connected in cascade.

7. Vertical reflection circuit for yokes of kinescopes and monitors, particularly of the high definition type, wherein a power amplifier is fed by a first supply of voltage source to generate in said yoke a deflection circuit, said vertical deflection circuit comprising switching means activatable to connect to the amplifier a second source of a supply of voltage higher than said first source, and flyback detector means for activating such switching means at the beginning of the flyback, characterized in that said flyback detector means comprises at least one transistor controlled by the voltage across the ends of the yoke.

* * * * *